(12) United States Patent
Wu et al.

(10) Patent No.: US 12,336,172 B2
(45) Date of Patent: Jun. 17, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Tieh-Chiang Wu, Hefei (CN); Lingxin Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 526 days.

(21) Appl. No.: 17/846,011

(22) Filed: Jun. 22, 2022

(65) Prior Publication Data

US 2023/0328971 A1    Oct. 12, 2023

Related U.S. Application Data

(63) Continuation of application No. PCT/CN2022/086178, filed on Apr. 11, 2022.

(30) Foreign Application Priority Data

Mar. 22, 2022    (CN) .......................... 202210304778.6

(51) Int. Cl.
*H10B 20/20* (2023.01)

(52) U.S. Cl.
CPC .................................. *H10B 20/20* (2023.02)

(58) Field of Classification Search
CPC . H01L 23/5256; H01L 23/5252; H10B 20/20; H10B 20/25
See application file for complete search history.

(56) References Cited

U.S. PATENT DOCUMENTS

| | | | | |
|---|---|---|---|---|
| 9,379,119 B1* | 6/2016 | Huang | ................... | H10B 10/12 |
| 9,865,736 B2* | 1/2018 | Chang | ................... | H01L 23/485 |
| 9,871,132 B1* | 1/2018 | Liu | ..................... | H10D 30/0212 |
| 2007/0210411 A1* | 9/2007 | Hovis | ................. | H01L 23/5256 |
| | | | | 257/E23.149 |
| 2012/0080736 A1* | 4/2012 | Onuma | ................ | H10D 89/10 |
| | | | | 257/314 |

(Continued)

FOREIGN PATENT DOCUMENTS

| CN | 102054817 A | 5/2011 |
|---|---|---|
| CN | 103066055 A | 4/2013 |

(Continued)

*Primary Examiner* — Evren Seven
(74) *Attorney, Agent, or Firm* — Kilpatrick Townsend & Stockton LLP (57) ABSTRACT

Embodiments relate to the field of semiconductors, and provide a semiconductor structure and a fabricating method thereof. The semiconductor structure includes: a substrate (100), and a gate oxide layer (110) on a surface of the substrate (100); a gate stack layer (120) positioned on a surface of the gate oxide layer (110); a spacer (130) at least covering a first sidewall of the gate stack layer (120); a contact structure (140) at least positioned on the surface of the substrate (100); and a dielectric layer (150) at least positioned between the contact structure (140) and a second sidewall of the gate stack layer (120). The first sidewall and the second sidewall are arranged opposite to each other, and a thickness of the dielectric layer (150) is less than a thickness of the spacer (130). A breakdown difficulty of a fuse structure may be reduced at least.

15 Claims, 4 Drawing Sheets

(56) References Cited

U.S. PATENT DOCUMENTS

| | | |
|---|---|---|
| 2014/0183689 A1 | 7/2014 | Sung |
| 2018/0019248 A1* | 1/2018 | Kasai ................. G11C 17/16 |
| 2023/0135418 A1* | 5/2023 | Liu ..................... H10B 20/25 |
| | | 257/530 |
| 2024/0321369 A1* | 9/2024 | Paul ................... H01L 23/5256 |

FOREIGN PATENT DOCUMENTS

| | | |
|---|---|---|
| CN | 103137553 A | 6/2013 |
| CN | 104347589 A | 2/2015 |
| CN | 108735710 A | 11/2018 |
| CN | 109075153 A | 12/2018 |
| CN | 111384023 A | 7/2020 |
| CN | 113496987 A | 10/2021 |
| JP | 2012079942 A | 4/2012 |

* cited by examiner

SEMICONDUCTOR STRUCTURE AND FABRICATION METHOD THEREOF

CROSS-REFERENCE TO RELATED APPLICATION

The present disclosure is a continuation of PCT/CN2022/086178, filed on Apr. 11, 2022, which claims priority to Chinese Patent Application No. 202210304778.6 titled "SEMICONDUCTOR STRUCTURE AND FABRICATION METHOD THEREOF" and filed on Mar. 22, 2022, the entire contents of which are incorporated herein by reference.

TECHNICAL FIELD

Embodiments of the present disclosure relate to the field of semiconductors, and more particularly, to a semiconductor structure and a fabrication method thereof.

BACKGROUND

In the field of integrated circuit fabrication, an electric fuse (efuse) refers to a connection line whose resistance may be greatly changed (from a low-impedance state to a high-impedance state) or which may be blown in an integrated circuit.

Main uses of the efuse include: (1) starting redundant circuits to replace defective circuits on the same chip, thereby effectively improving process yield. In the above use, the efuse is connected to the redundant circuits in the integrated circuit. Once it is found that the integrated circuit is defective in test, the efuse is employed to repair or replace the defective circuits. (2) The efuse is also used for implementing programmed functions of the integrated circuit. To implement the above functions, metal interconnections, device arrays and programmed circuits (including efuse devices) are first processed on the chip, and then data are inputted from outside. That is, standard chips are fabricated into various unique ones by means of the programmed circuits The efuse can greatly save costs of chip development and fabrication in the programmed functions of the integrated circuit, so it is widely used in programmable read only memory (PROM). During the programming process of the integrated circuit, write of the information "1" is completed by generating an open circuit by blowing the efuse out at a higher voltage, while the unbroken efuse remains a connected state, i.e., the state "0".

At present, there exists problem that the efuse is difficult to blow out.

SUMMARY

Embodiments of the present disclosure provide a semiconductor structure and a fabrication method thereof, which can at least reduce fusing difficulty of an electric fuse (efuse).

According to some embodiments of the present disclosure, one aspect of the embodiments of the present disclosure provides a semiconductor structure, including: a substrate and a gate oxide layer positioned on a surface of the substrate; a gate stack layer positioned on a surface of the gate oxide layer; a spacer at least covering a first sidewall of the gate stack layer; a contact structure at least positioned on the surface of the substrate; and a dielectric layer at least positioned between the contact structure and a second sidewall of the gate stack layer. The first sidewall and the second sidewall are arranged opposite to each other, and a thickness of the dielectric layer is less than a thickness of the spacer.

In some embodiments, the spacer is also positioned on part of a top surface of the gate stack layer, and part of the contact structure is positioned above the gate stack layer.

In some embodiments, a projection of the contact structure on the surface of the substrate is overlapped with a projection of the gate stack layer on the surface of the substrate, and a width of an overlapped portion is less than or equal to 0.1 to 0.5 of a width of the gate stack layer.

In some embodiments, the thickness of the dielectric layer is less than that of the gate oxide layer.

In some embodiments, part of the contact structure is positioned within an active area of the substrate.

In some embodiments, the contact structure includes a contact layer, a barrier layer and a conductive layer, where the barrier layer is positioned between the contact layer and the conductive layer, and the contact layer is positioned within the active area.

In some embodiments, the thickness of the dielectric layer is less than or equal to 3 nm.

According to some embodiments of the present disclosure, another aspect of the embodiments of the present disclosure also provides a method for fabricating a semiconductor structure. The method includes: providing a substrate, a gate oxide layer being formed on a surface of the substrate, and a gate stack layer being formed on the gate oxide layer; forming a spacer at least covering a first sidewall of the gate stack layer; forming a dielectric layer at least covering a second sidewall of the gate stack layer, the first sidewall and the second sidewall being arranged opposite to each other, and a thickness of the dielectric layer being less than that of the spacer; and forming a contact structure at least positioned on the surface of the substrate, where the contact structure is in contact with a surface of the dielectric layer.

In some embodiments, the forming the spacer includes: forming an initial spacer covering a sidewall and a top surface of the gate stack layer and a surface of the substrate; and patterning the initial spacer, and removing the initial spacer on a surface of the second sidewall of the gate stack layer, where rest of the initial spacer on a surface and a top surface of the first sidewall of the gate stack layer is used as the spacer.

In some embodiments, the patterning the initial spacer includes: forming a groove, which exposes at least the second sidewall and part of the top surface of the gate stack layer, where the groove also exposes the substrate.

In some embodiments, the forming the dielectric layer includes: depositing a dielectric material on a sidewall and a bottom of the groove, removing the dielectric material at the bottom of the groove, and forming a dielectric layer covering the second sidewall of the gate stack layer.

In some embodiments, before removing the dielectric material at the bottom of the groove, the method further includes: performing ion implantation on the substrate at the bottom of the groove.

In some embodiments, the forming the contact structure includes: forming a contact layer at the bottom of the groove, the contact layer being electrically connected to the substrate; forming a barrier layer positioned on the surface of the dielectric layer and a top surface of the contact layer; and forming a conductive layer filling up the groove.

In some embodiments, the forming the dielectric layer includes: controlling the thickness of the dielectric layer to be smaller than that of the gate oxide layer.

In some embodiments, a projection of the contact structure on the surface of the substrate is overlapped with a projection of the gate stack layer on the surface of the substrate, and a width of an overlapped portion is less than or equal to 0.1 to 0.5 of that of the gate stack layer.

The technical solutions provided by the embodiments of the present disclosure at least have following advantages. An electric fuse (efuse) is constituted by a substrate, a gate oxide layer, a gate stack layer, a contact structure, and a dielectric layer. By arranging the contact structure adjacent to the gate stack layer, when a voltage across the gate stack layer is large enough, a breakdown path of the efuse is changed to the gate stack layer—the dielectric layer—the contact structure, such that breakdown difficulty of the entire semiconductor structure may be reduced. By setting the thickness of the dielectric layer to be smaller than that of the spacer, a breakdown contact path between the gate stack layer and the contact structure can be reduced, such that the breakdown difficulty of the entire semiconductor structure can be reduced.

BRIEF DESCRIPTION OF THE DRAWINGS

Exemplary descriptions of one or more embodiments are made by means of pictures in corresponding drawings, and these exemplary descriptions do not constitute a limitation on the embodiments. Unless otherwise stated, the pictures in the drawings do not constitute a scale limitation. Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Embodiments of the present disclosure provide a semiconductor structure. By arranging a contact structure adjacent to a gate stack layer and by reducing a thickness of a dielectric layer between the gate stack layer and the contact structure, a breakdown path of the semiconductor structure is changed from the gate stack layer-a gate oxide layer and a substrate—the contact structure to the gate stack layer—the dielectric layer—the contact structure. By changing from breaking down the semiconductor structure by breaking down the gate oxide layer to breaking down the semiconductor structure by breaking down the dielectric layer, a breakdown difficulty of the entire semiconductor structure can be reduced, and a transmission path for transmission of an entire electrical signal may be reduced. In this way, loss of the electrical signal can be reduced during transmission of the electrical signal, and thus sensitivity of the semiconductor structure can be improved.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the embodiments of the present disclosure may also be implemented even without these technical details or various variations and modifications based on the following embodiments.

Figure 1:
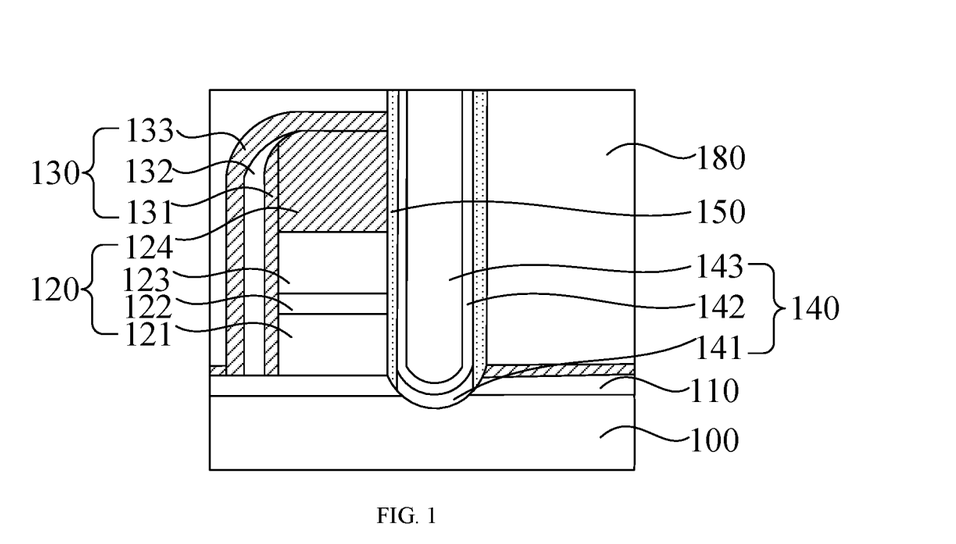
FIG. 1 is a cross-sectional view of a semiconductor structure according to an embodiment of the present disclosure.
Figure 2:
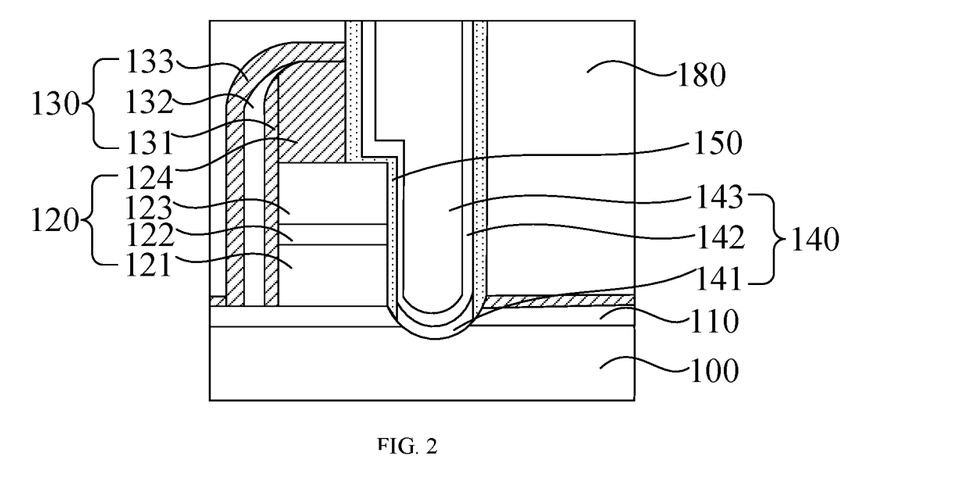
FIG. 2 is a cross-sectional view of another semiconductor structure according to an embodiment of the present disclosure.

Referring to FIG. 1 and FIG. 2, FIG. 1 is a cross-sectional view of a semiconductor structure according to an embodiment of the present disclosure, and FIG. 2 is a cross-sectional view of another semiconductor structure according to an embodiment of the present disclosure.

In some embodiments, referring to FIG. 1 and FIG. 2, the semiconductor structure includes: a substrate 100 and a gate oxide layer 110 positioned on a surface of the substrate 100; a gate stack layer 120 positioned on a surface of the gate oxide layer 110; a spacer 130 at least covering a first sidewall of the gate stack layer 120; a contact structure 140 at least positioned on the surface of the substrate 100; a dielectric layer 150 at least positioned between the contact structure 140 and a second sidewall of the gate stack layer 120. The first sidewall and the second sidewall are arranged opposite to each other, and a thickness of the dielectric layer 150 is less than that of the spacer 130.

The substrate 100, the gate oxide layer 110, the gate stack layer 120, the contact structure 140 and the dielectric layer 150 constitute an electric fuse (efuse). By supplying a sufficient voltage to the gate stack layer 120, the dielectric layer 150 between the gate stack layer 120 and the contact structure 140 may be broken down, thereby forming a conductive path in the dielectric layer 150, such that the gate stack layer 120 is electrically connected to the contact structure 140. A signal of the semiconductor structure is outputted by means of the contact structure 140. By setting a breakdown path of the semiconductor structure to the gate stack layer 120—the dielectric layer 150—the contact structure 140, a breakdown difficulty of the entire semiconductor structure may be reduced, and a transmission path for transmission of an entire electrical signal can be reduced. In this way, loss of the electrical signal can be reduced during transmission of the electrical signal, and thus sensitivity of the semiconductor structure can be improved.

In some embodiments, a material of the substrate 100 may be a material such as silicon, germanium, or silicon germanium, and the material of the substrate 100 may also be doped with other materials. Taking an example where the material of the substrate 100 is silicon, the substrate 100 may be doped with a small amount of trivalent element such as boron, indium, gallium or aluminum, thereby forming a P-type substrate. Similarly, the substrate 100 may be doped with a small amount of pentavalent element such as phosphorus, antimony or arsenic, thereby forming an N-type substrate. Elements doped into the substrate 100 may be selected based on aspects such as actual requirements and product performance, and the embodiments of the present disclosure do not limit the material of the substrate 100 or the elements doped into the substrate 100.

In some embodiments, the gate oxide layer 110 is configured to avoid direct contact between the gate stack layer 120 and the substrate 100. A breakdown principle of the gate oxide layer 110 is as below. When a higher voltage is applied to an interface between an upper layer and a lower layer of the gate oxide layer 110, defects in the gate oxide layer 110 will form electron traps, which are randomly distributed in a middle of the gate oxide layer 110. Under an action of an electric field of the gate oxide layer 110, each of the electron traps may have ability to capture electrons. Under the action of the high electric field, regions where the electron traps capture the electrons may be overlapped with each other, thereby forming a current channel of the gate oxide layer 110, where this channel becomes a channel for the occurrence of potential breakdown. As a current of the gate stack layer 120 continues to increase, the current channel of the gate oxide layer 110 is formed, and thus performance of the gate oxide layer 110 declines slowly. When the current is further discharged through the current channel, the gate oxide layer 110 may be broken down. The distribution of the electron traps in the gate oxide layer 110 is random, and the thinner the gate oxide layer 110 is, the smaller the number of electron traps required to form the channel is. Therefore, breakdown of a thinner gate oxide layer 110 is more prone to occur than a thicker gate oxide layer 110.

In some embodiments, the gate stack layer 120 may be a four-layer structure, including a first conductive layer 121, an intermediate layer 122, a second conductive layer 123, and a protective layer 124. The first conductive layer 121 is positioned on a top surface of the gate oxide layer 110, the intermediate layer 122 is positioned between the first conductive layer 121 and the second conductive layer 123, and the protective layer 124 is at least positioned on a top surface of the second conductive layer 123. In some other embodiments, the gate stack layer 120 may also be a single-layer structure. In other embodiments, the gate stack layer 120 may also be formed by stacking other layers, and number of layers of the gate stack layer 120 is not limited in the embodiments of the present disclosure.

Taking an example where the gate stack layer 120 is the four-layer structure, a material of the first conductive layer 121 may be a semiconductor material such as polysilicon; a material of the intermediate layer 122 may be titanium nitride or gallium nitride, etc.; a material of the second conductive layer 123 may be a metal material having better electrical conductivity, such as tungsten; and a material of the protective layer 124 may be a hard insulating material, such as silicon nitride.

Taking an example where the material of the first conductive layer 121 is the polysilicon, during transmission of an electrical signal between the gate stack layer 120 and the substrate 100, the electrical signal may be transmitted from a semiconductor material to another electrical signal instead of being directly transmitted from the semiconductor material to other materials, thereby preventing occurrence of an exception during transmission of the electrical signal. In this way, stability of signal transmission can be improved for the semiconductor structure, and thus reliability of the semiconductor structure can be improved.

Taking an example where the material of the intermediate layer 122 is titanium nitride, the intermediate layer 122 is provided to isolate the first conductive layer 121 from the second conductive layer 123, to prevent metal ions of the second conductive layer 123 from diffusing into the first conductive layer 121 in the event of ion diffusion. The intermediate layer 122 can prevent the ion diffusion of the second conductive layer 123 from contaminating the first conductive layer 121. In this way, stability of the first conductive layer 121 can be improved, and thus the reliability of the semiconductor structure can be improved.

Taking an example where the material of the second conductive layer 123 is tungsten, the electrical conductivity of tungsten is higher than that of a semiconductor material such as polysilicon. Therefore, when the material of the second conductive layer 123 is metal material, the electrical conductivity of the gate stack layer 120 can be improved, a speed of transmission of the electrical signal can be increased for the gate stack layer 120, and thus performance of the semiconductor structure can be further improved.

Taking an example where the material of the protective layer 124 is silicon nitride, in some embodiments, the protective layer 124 covers the top surface of the second conductive layer 123. The protective layer 124 can share stress for the first conductive layer 121, the intermediate layer 122 and the second conductive layer 123 when external pressure is applied to the semiconductor structure, such that the stress applied on the first conductive layer 121, the intermediate layer 122 and the second conductive layer 123 is reduced. In this way, the first conductive layer 121, the intermediate layer 122 and the second conductive layer 123 are protected, and thus the reliability of the semiconductor structure can be further improved.

In some embodiments, the spacer 130 may be formed by stacking a multi-layer structure. The spacer 130 may include a first spacer 131, a second spacer 132, and a third spacer 133. The first spacer 131 is at least covered on the first sidewall of the gate stack layer 120, the second spacer 132 is positioned between the first spacer 131 and the third spacer 133. In some other embodiments, the spacer 130 may also be a single-layer structure, and number of layers of the spacer 130 is not limited in the embodiments of the present disclosure.

Taking an example where the spacer 130 is a three-layer structure, the first spacer 131 and the third spacer 133 may be made from the same material such as silicon nitride, and the material of the second spacer 132 may be silicon oxide.

In some embodiments, the spacer 130 is a Nitride-Oxide-Nitride (NON) structure, i.e., a nitride layer-oxide layer-nitride layer structure. Arrangement of the second spacer 132 can improve insulation between the first spacer 131 and the third spacer 133. However, the second spacer 132 is softer in material and poorer in shape. Therefore, by forming the first spacer 131 and the third spacer 133 whose materials are the nitride layers, the shape of the second spacer 132 can be improved.

In some other embodiments, after the spacer 130 is formed, the substrate 100 is further lightly doped and heavily doped. A certain space difference needs to be kept between light dope and heavy dope, the first spacer 131 may be used as a lightly-doped mask, and the third spacer 133 may be used as a heavily-doped mask, to facilitate the subsequent doping of the substrate 100.

In some embodiments, the contact structure 140 may be formed by stacking a multi-layer structure, and the contact structure 140 may include a contact layer 141, a barrier layer 142, and a conductive layer 143. The contact layer 141 is positioned on the surface of the substrate 100, and the barrier layer 142 is positioned between the contact layer 141 and the conductive layer 143. In some other embodiments, the contact structure 140 may also be a single-layer structure. Number of layers of the contact structure 140 is not limited in the embodiments of the present disclosure.

Taking an example where the contact structure 140 is a three-layer structure, a material of the contact layer 141 may be a compound of a metal and a semiconductor material or a metal-doped semiconductor material, such as cobalt silicide. A material of the barrier layer 142 may be titanium nitride or gallium nitride, etc., and a material of the conductive layer 143 may be a metal material such as tungsten.

Arrangement of the contact layer 141 can reduce Schottky barrier between the contact structure 140 and the substrate 100, such that contact resistance between the contact structure 140 and the substrate 100 is reduced, and thus response speed of the semiconductor structure can be increased.

Taking an example where the material of the contact layer 141 is cobalt silicide, crystal lattice of cobalt silicide and crystal lattice of silicon can match with each other well, such that defects between the contact layer 141 and the substrate 100 can be reduced. Compared with directly forming metal on the surface of the substrate 100 to serve as the contact structure 140, the contact resistance between the contact structure 140 and the substrate 100 and the defects between the contact layer 141 and the substrate 100 can be reduced by forming the contact layer 141 first, such that performance of the semiconductor structure can be improved. In some other embodiments, the material of the contact layer 141 may also be a metal silicide such as nickel silicide.

By forming the barrier layer 142, metal ions of the conductive layer 143 can be prevented from diffusing into the contact layer 141 in the event of ion diffusion. That is, the barrier layer 142 can prevent the ion diffusion of the conductive layer 143 from contaminating the contact layer 141. In this way, stability of the contact layer 141 can be improved, and thus the reliability of the semiconductor structure can be improved. In some embodiments, the material of the barrier layer 142 may include at least one of titanium nitride, tantalum nitride, or tantalum silicide.

In some embodiments, the material of the conductive layer 143 may be tungsten, and the electrical conductivity of tungsten is higher than that of a semiconductor material such as polysilicon. Therefore, when the material of the conductive layer 143 is metal material, the electrical conductivity of the contact structure 140 can be improved, a speed of transmission of the electrical signal can be increased for the contact structure 140, and thus performance of the semiconductor structure can be improved. In some other embodiments, the material of the conductive layer may also be a metal such as molybdenum, or a semiconductor material such as polysilicon.

Referring to FIG. 2, in some embodiments, the spacer 130 is positioned on part of a top surface of the gate stack layer 120, and part of the contact structure 140 is positioned above the gate stack layer 120. Space may be reserved for the contact structure 140 by arranging the spacer 130 on part of the top surface of the gate stack layer 120, such that part of the contact structure 140 is positioned above the gate stack layer 120, thereby increasing a breakdown area between the gate stack layer 120 and the contact structure 140, where the breakdown area includes area of sidewalls of the first conductive layer 121, the intermediate layer 122 and the second conductive layer 123 directly facing the contact structure 140, and the breakdown area also includes area of the top surface of the second conductive layer 123 directly facing the contact structure 140. The breakdown difficulty can be reduced for the semiconductor structure by increasing the size of the breakdown area. The breakdown difficulty can be reduced for the semiconductor structure by changing the breakdown path of the semiconductor structure to the gate stack layer 120—the dielectric layer 150—the contact structure 140. Furthermore, by arranging the contact structure 140 above the gate stack layer 120, a volume of the contact structure 140 partially positioned on the surface of the substrate 100 can be reduced, such that the volume of the entire semiconductor structure can be reduced.

Referring to FIG. 2, in some embodiments, a projection of the contact structure 140 on the surface of the substrate 100 is overlapped with a projection of the gate stack layer 120 on the surface of the substrate 100, and a width of an overlapped portion is less than or equal to 0.1 to 0.5 of a width of the gate stack layer 120. It is to be understood that the more the overlapped portions are, the larger the breakdown area between the corresponding gate stack layer 120 and the contact structure 140 is. However, the more the overlapped portions are, the less the protective layer 124 and the spacer 130 positioned on the second conductive layer 123 are, and correspondingly, the poorer the protective effect provided by the protective layer 124 and the spacer 130 to the first conductive layer 121, the intermediate layer 122 and the second conductive layer 123 is. However, the less the overlapped portions are, the better the protective effect provided by the protective layer 124 and the spacer 130 to the first conductive layer 121, the intermediate layer 122 and the second conductive layer 123 is. That is, by setting the width of the overlapped portion to be less than or equal to 0.1 to 0.5 of that of the gate stack layer 120, a certain protective effect can be provided while increasing the breakdown area between the gate stack layer 120 and the contact structure 140.

In some embodiments, part of the contact structure 140 is positioned within an active area of the substrate 100. In some embodiments, part of the contact structure 140 is arranged in the substrate 100 to ensure electrical connection between the contact structure 140 and the substrate 100, thereby ensuring that an electrical signal is outputted from the substrate 100 and the gate stack layer 120 by means of the contact structure 140.

In some embodiments, the contact layer 141 is positioned within the active area. In some embodiments, a top surface of the contact layer 141 may be flush with that of the substrate 100, or the top surface of the contact layer 141 may be higher than that of the substrate 100. That is, a bottom surface of the barrier layer 142 is flush with the top surface of the substrate 100, or the bottom surface of the barrier layer 142 is higher than the top surface of the substrate 100. In some other embodiments, the top surface of the contact layer 141 may be lower than that of the substrate 100. That is, the bottom surface of the barrier layer 142 is lower than the top surface of the substrate 100. By arranging the contact layer 141 in the substrate 100, the electrical connection between the contact structure 140 and the substrate 100 is ensured, thereby improving the stability of the semiconductor structure.

It is to be noted that the "flush" may indicate that the top surface of the contact layer 141 is completely flush with the top surface of the substrate 100, or a height difference between the top surface of the contact layer 141 and the top surface of the substrate 100 is within 1 nm. When the height difference between the top surface of the contact layer 141 and the top surface of the substrate 100 is within 1 nm, it is also to be considered that the top surface of the contact layer 141 may be flush with the top surface of the substrate 100.

Referring to FIG. 1, in some embodiments, the spacer 130 may also cover the entire top surface of the gate stack layer 120. That is, the contact structure 140 is arranged opposite to the second sidewall of the gate stack layer 120, i.e., the projection of the gate stack layer 120 on the surface of the substrate 100 is adjacent to the projection of the contact structure 140 on the surface of the substrate 100.

The dielectric layer 150 has opposite sidewalls, where one sidewall of the dielectric layer 150 is in contact with the gate stack layer 120, and the other sidewall of the dielectric layer 150 is in contact with the contact structure 140.

When a sufficient voltage is supplied to the gate stack layer 120, an electric field between the gate stack layer 120 and the contact structure 140 enables defects of the dielectric layer 150 to trap electrons. Under the action of the high electric field, regions where electrons are trapped by electron traps may be overlapped with each other, such that a current channel is formed on the dielectric layer 150. As the current in the gate stack layer 120 continues to increase, the current channel on the dielectric layer 150 is conducted, thereby forming breakdown, such that an electrical signal is propagated from the gate stack layer 120 to the contact structure 140, and the electrical signal from the semiconductor structure is outputted by means of the contact structure 140.

The dielectric layer 150 is configured to isolate the contact structure 140 from the gate stack layer 120, to avoid direct contact between the contact structure 140 and the gate stack layer 120. By means of breakdown of the dielectric layer 150, the gate stack layer 120 and the contact structure 140 are conducted, thereby reducing breakdown difficulty of the efuse. By setting the thickness of the dielectric layer 150 to be smaller than that of the spacer 130, the breakdown difficulty of the dielectric layer 150 may be reduced, thereby improving breakdown sensitivity of the semiconductor structure. It is to be noted that the breakdown sensitivity refers to the breakdown difficulty. The higher the breakdown sensitivity is, the lower the breakdown difficulty is; and the lower the breakdown sensitivity is, the higher the breakdown difficulty is.

In some embodiments, the dielectric layer 150 and the gate oxide layer 110 may be made from the same material such as silicon oxide. In another embodiment, the material of the dielectric layer may be different from the material of the gate oxide layer. The material of the dielectric layer may also be other materials that are easier to be broken down, such that the breakdown difficulty of the semiconductor structure can be reduced.

In some embodiments, the thickness of the dielectric layer 150 may be smaller than that of the gate oxide layer 110. It is to be understood that the smaller the thickness is, the lower the corresponding breakdown difficulty is, i.e., the easier the breakdown occurs. Therefore, by setting the thickness of the dielectric layer 150 to be smaller than that of the gate oxide layer 110, possibility of breakdown of the dielectric layer 150 may be increased, such that the breakdown path of the semiconductor structure is changed to the gate stack layer 120—the dielectric layer 150—the contact structure 140, and thus the breakdown difficulty of the semiconductor structure is reduced.

It is to be noted that referring to FIG. 1, the thickness of the dielectric layer 150 is a size of the dielectric layer 150 in a direction where the gate stack layer 120 faces to the contact structure 140. Referring to FIG. 2, the thickness of the dielectric layer 150 on the sidewalls of the first conductive layer 121, the intermediate layer 122 and the second conductive layer 123 is the size of the dielectric layer 150 perpendicular to a direction where the first conductive layer 121 faces to the intermediate layer 122. The thickness of the dielectric layer 150 above the second conductive layer 123 is the size of the dielectric layer 150 in the direction where the first conductive layer 121 faces to the intermediate layer 122.

In some embodiments, the thickness of the dielectric layer 150 is less than or equal to 3 nm. It is to be understood that the smaller the thickness of the dielectric layer 150 is, the lower the breakdown difficulty of the dielectric layer 150 is; and the smaller the thickness of the dielectric layer 150 is, the smaller the current required to break down the dielectric layer is. By setting the thickness of the dielectric layer 150 to be less than 3 nm, the possibility of breakdown of the dielectric layer 150 may be improved. By means of breakdown of the dielectric layer 150, an electrical signal may be transmitted from the gate stack layer 120 to the contact structure 140, and the breakdown difficulty of the semiconductor structure can be reduced. In some embodiments, the semiconductor structure further includes a filling layer 180, which is configured to fill the semiconductor structure. Other structures may be formed on the semiconductor structure by patterning the filling layer 180. A material of the filling layer 180 may be oxide.

According to the embodiments of the present disclosure, by providing the contact structure 140 arranged adjacent to the gate stack layer 120 and by reducing the thickness of the dielectric layer 150 between the gate stack layer 120 and the contact structure 140, the breakdown path of the semiconductor structure is changed to the gate stack layer 120—the dielectric layer 150—the contact structure 140. Controlling breakdown of the dielectric layer 150 may cause the semiconductor structure to be broken down, which may reduce the breakdown difficulty of the entire semiconductor structure and reduce the transmission path for transmission of an entire electrical signal. In this way, loss of the electrical signal can be reduced during transmission of the electrical signal, and thus performance of the semiconductor structure can be improved.

Another embodiment of the present disclosure also provides a method for fabricating a semiconductor structure, and the method for fabricating a semiconductor structure may be configured for forming the semiconductor structure in the foregoing embodiments. Reference may be made to the embodiments described in FIG. 1 and FIG. 2 for the same or corresponding parts, and detailed description thereof will be omitted below. The method for fabricating a semiconductor structure provided by another embodiment of the present disclosure will be described in detail below with reference to the accompanying drawings. FIGS. 3 to 7 are schematic structural diagrams corresponding to steps of a method for fabricating a semiconductor structure according to another embodiment of the present disclosure.

Figure 3:
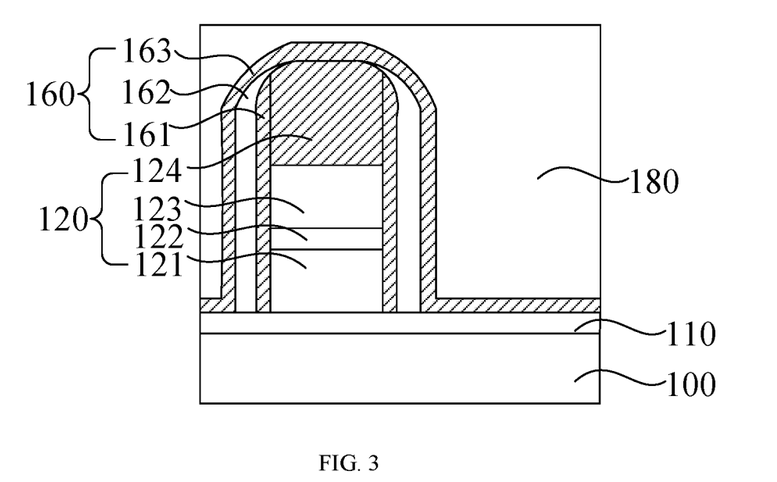
FIGS. 3 to 7 are schematic structural diagrams corresponding to steps of a method for fabricating a semiconductor structure according to another embodiment of the present disclosure.
Figure 4:
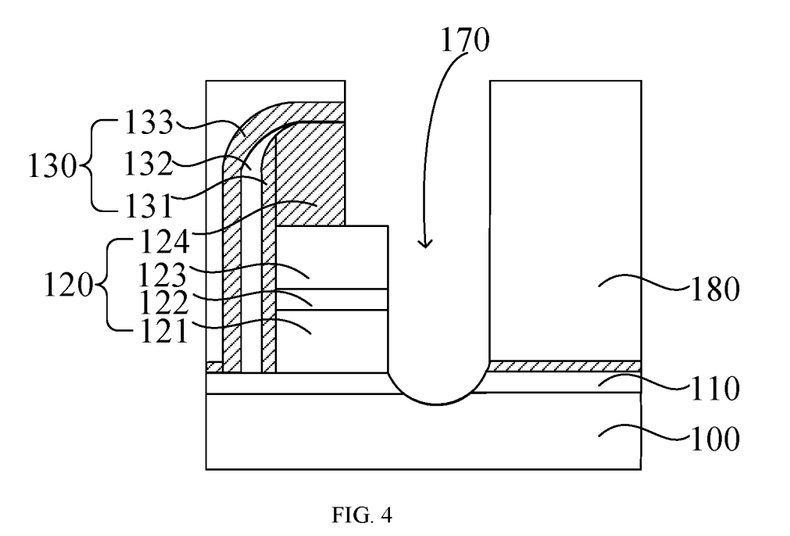

Referring to FIG. 3 and FIG. 4, a substrate 100 is provided, where a gate oxide layer 110 is formed on a surface of the substrate 100, and a gate stack layer 120 is formed on the gate oxide layer 110. A spacer 130 is formed, where the spacer 130 at least covers a first sidewall of the gate stack layer 120.

In some embodiments, the gate stack layer 120 may be a four-layer structure, including a first conductive layer 121, an intermediate layer 122, a second conductive layer 123, and a protective layer 124. The first conductive layer 121 is positioned on a top surface of the gate oxide layer 110, the intermediate layer 122 is positioned between the first conductive layer 121 and the second conductive layer 123, and the protective layer 124 is positioned on a top surface of the second conductive layer 123. In some other embodiments, the gate stack layer 120 may also be a single-layer structure. In other embodiments, the gate stack layer 120 may also be formed by stacking other number of layers.

In some embodiments, the spacer 130 may include a first spacer 131, a second spacer 132, and a third spacer 133. The first spacer 131 is at least covered on the first sidewall of the gate stack layer 120, the second spacer 132 is positioned between the first spacer 131 and the third spacer 133. In some other embodiments, the spacer 130 may also be a single-layer structure.

In some embodiments, the forming the spacer 130 includes: forming an initial spacer 160 covering a sidewall and a top surface of the gate stack layer 120 and a surface of the substrate 100; and patterning the initial spacer 160, and removing the initial spacer 160 on a surface of the second sidewall of the gate stack layer 120, where rest of the initial spacer 160 on a surface and a top surface of the first sidewall of the gate stack layer 120 is used as the spacer 130.

Referring to FIG. 3, in some embodiments, the forming the initial spacer 160 includes: forming a first initial spacer 161 covering the first sidewall and the second sidewall of the gate stack layer 120; forming a second initial spacer 162 covering a sidewall of the first initial spacer 161 and the top surface of the gate stack layer 120; and forming a third initial spacer 163 covering a top surfaces of the second initial spacer 162.

In some embodiments, the third initial spacer 163 and the first initial spacer 161 may be made from the same material such as nitride, and the material of the second initial spacer 162 may be oxide, thus forming the NON structure. The second initial spacer 162 is an oxide layer, which can improve the insulation between the first initial spacer 162 and the third initial spacer 163. However, a material of the oxide layer is softer, and the second initial spacer 162 formed has a poorer shape. Therefore, by forming the first initial spacer 161 and the third initial spacer 163 whose materials are nitride layer, the shape of the second initial spacer 162 can be improved.

In some other embodiments, the initial spacer 160 may also be used as a mask for lightly doping and heavily doping the substrate 100, to control an area of a lightly-doped region and an area of a heavily-doped region.

Referring to FIG. 4, the initial spacer 160 (referring to FIG. 3) is patterned, the initial spacer 160 positioned on a surface of the second sidewall of the gate stack layer 120 is removed, and rest of the initial spacer 160 positioned on a surface and a top surface of the first sidewall of the gate stack layer 120 is used as the spacer 130. By patterning the initial spacer 160 (referring to FIG. 3), a process space is provided for the subsequent formation of the dielectric layer and the contact structure.

Furthermore, by controlling areas and positions of the patterned initial spacer 160 (referring to FIG. 3) and the protective layer 124, total area and corresponding positions of the dielectric layer and the contact structure formed subsequently may be controlled. In some embodiments, part of the patterned initial spacer 160 (referring to FIG. 3) includes the initial spacer 160 (referring to FIG. 3) positioned on part of the top surface of the gate stack layer 120 and the initial spacer 160 (referring to FIG. 3) positioned on the second sidewall of the gate stack layer 120. In some other embodiments, part of the patterned initial spacer 160 (referring to FIG. 3) includes only the initial spacer 160 (referring to FIG. 3) positioned on the second sidewall of the gate stack layer 120.

In some embodiments, the process of patterning the initial spacer 160 (referring to FIG. 3) further includes patterning part of the protective layer 124 to expose part of the second conductive layer 123, such that a process basis is provided for the subsequent formation of the dielectric layer and the contact structure partially positioned on the second conductive layer 123.

In some embodiments, the patterning the initial spacer (referring to FIG. 3) includes: forming a groove 170, where the groove 170 exposes at least the second sidewall and part of the top surface of the gate stack layer 120, and the groove 170 also exposes the substrate 100. By forming the groove 170 exposing the second sidewall and part of the top surface of the gate stack layer 120, a process basis may be provided for the subsequent formation of the dielectric layer and the contact structure partially positioned on the second conductive layer. By controlling the position and the area of the groove 170, positions and areas of the dielectric layer and the contact structure formed subsequently may be controlled.

In some other embodiments, the groove may only expose the second sidewall of the gate stack layer and part of the substrate.

Figure 5:
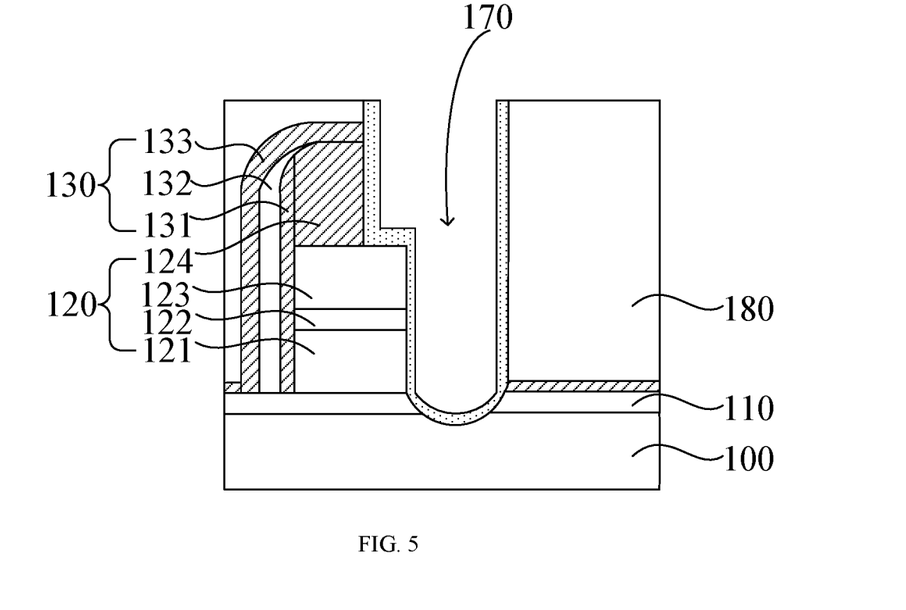
Figure 6:
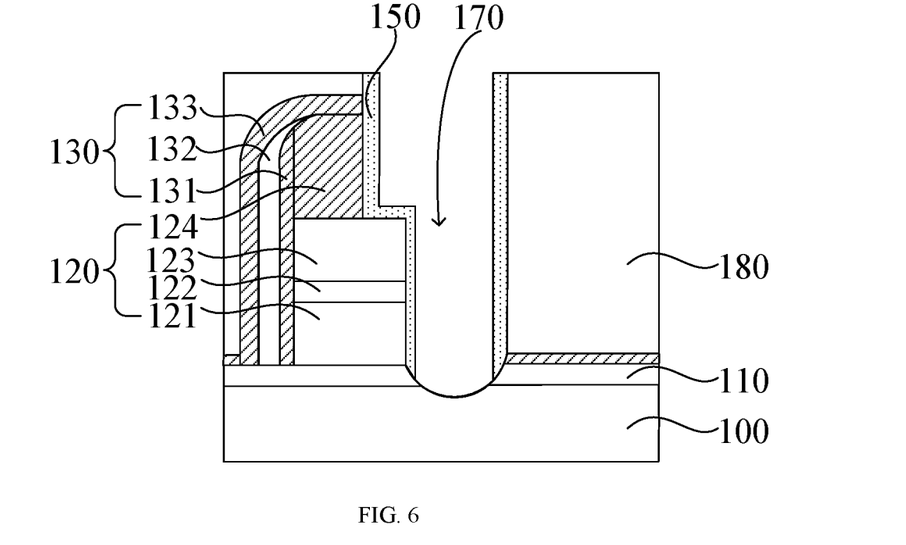

Referring to FIG. 5 and FIG. 6, a dielectric layer 150 is formed, and the dielectric layer 150 at least covers the second sidewall of the gate stack layer 120, where the first sidewall and the second sidewall are arranged opposite to each other, and the thickness of the dielectric layer 150 is smaller than that of the spacer 130.

In some embodiments, the forming the dielectric layer 150 includes: depositing a dielectric material on the sidewalls and the bottom of the groove 170, and removing the dielectric material at the bottom of the groove 170 to form the dielectric layer 150 covering the second sidewall of the gate stack layer 120. By setting the thickness of the dielectric layer 150 to be smaller than that of the spacer 130 and allowing the dielectric layer 150 to be arranged adjacent to the gate stack layer 120, the breakdown path of the semiconductor structure may be changed to the gate stack layer 120—the dielectric layer 150—the contact structure, which can reduce the breakdown difficulty of the dielectric layer 150, and thus improve the performance of the semiconductor structure.

In some embodiments, the dielectric material is also deposited on the exposed top surface of the second conductive layer 123, and formation of the dielectric layer 150 on the top surface of the second conductive layer 123 provides a process basis for the subsequent formation of the contact structure above the gate stack layer 120, preventing direct contact between the second conductive layer 123 and the contact structure formed on the top surface of the second conductive layer 123.

In some embodiments, the forming the dielectric layer 150 may include: forming the dielectric layer 150 on the sidewalls of the groove 170 by an atomic layer deposition technology, which has excellent thickness control performance and ensures relative uniformity of the thickness of the formed dielectric layer 150.

In some embodiments, before removing the dielectric material at the bottom of the groove 170, the method further includes: performing ion implantation on the substrate 100 at the bottom of the groove 170. A source and a drain of an MOS transistor are formed by performing ion implantation on the substrate 100 at the bottom of the groove 170.

In some embodiments, when performing ion implantation into the substrate 100, type of ions implanted may be controlled according to the type of the MOS transistor to be formed.

In some embodiments, the forming the dielectric layer 150 may include: controlling the thickness of the dielectric layer 150 to be smaller than that of the gate oxide layer 110. It is to be understood that the smaller the thickness is, the lower the corresponding breakdown difficulty is, i.e., the easier the breakdown occurs. Therefore, by setting the thickness of the dielectric layer 150 to be smaller than that of the gate oxide layer 110, possibility of breakdown of the dielectric layer 150 may be increased. By means of breakdown of the dielectric layer 150, an electrical signal is transmitted from the gate stack layer 120 to the contact structure 140, such that the breakdown difficulty of the semiconductor structure can be reduced.

Figure 7:
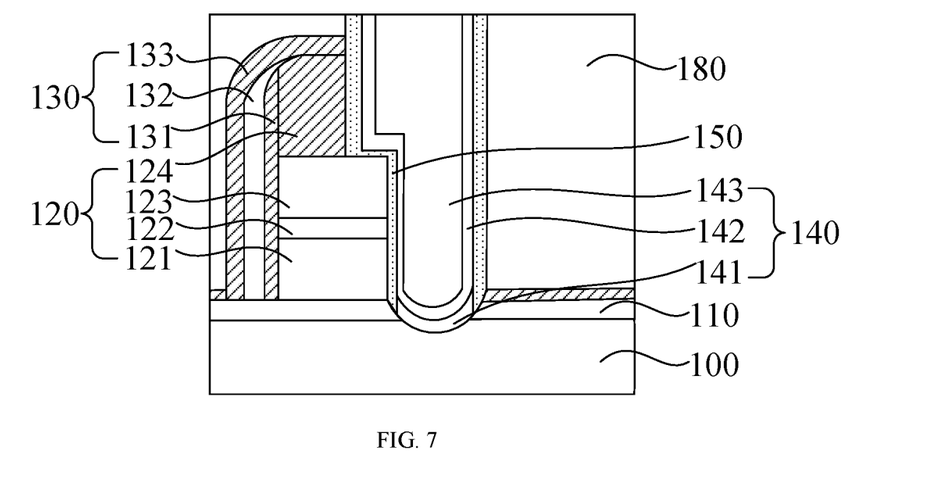

Referring to FIG. 7, a contact structure 140 is formed, where the contact structure 140 is at least positioned on the surface of the substrate 100, and the contact structure 140 is in contact with the surface of the dielectric layer 150.

In some embodiments, the forming the contact structure 140 may include: forming a contact layer 141 at the bottom of the groove 170 (referring to FIG. 6), the contact layer 141 being electrically connected to the substrate 100; forming a barrier layer 142 positioned on the surface of the dielectric layer 150 and a top surface of the contact layer 141; and forming a conductive layer 143 filling up the groove 170.

Formation of the contact layer 141 can reduce Schottky barrier between the contact structure 140 and the substrate 100, such that contact resistance between the contact structure 140 and the substrate 100 may be reduced, and thus response speed of the semiconductor structure can be increased. Furthermore, the material of the contact layer 141 is metal silicide, and crystal lattice of the metal silicide and crystal lattice of silicon can match with each other well, such that defects between the contact layer 141 and the substrate 100 can be reduced. Compared with directly forming metal on the surface of the substrate 100 to serve as the contact structure 140, the contact resistance between the contact structure 140 and the substrate 100 and the defects between the contact layer 141 and the substrate 100 can be reduced by forming the contact layer 141 first, such that performance of the semiconductor structure can be improved.

By forming the barrier layer 142, metal ions of the conductive layer 143 can be prevented from diffusing into the contact layer 141 in the event of ion diffusion. That is, the barrier layer 142 can prevent the ion diffusion of the conductive layer 143 from contaminating the contact layer 141. In this way, stability of the contact layer 141 can be improved, and thus the reliability of the semiconductor structure can be improved.

Formation of the conductive layer 143 can improve the electrical conductivity of the contact structure 140, improve the speed of transmission of the electrical signal for the contact structure 140, and thus improve the performance of the semiconductor structure.

In some embodiments, a projection of the contact structure 140 on the surface of the substrate 100 is overlapped with a projection of the gate stack layer 120 on the surface of the substrate 100, and a width of an overlapped portion is less than or equal to 0.1 to 0.5 of a width of the gate stack layer 120. The more the overlapped portions are, the larger the breakdown area between the corresponding gate stack layer 120 and the contact structure 140 is. However, the more the overlapped portions are, the less the protective layer 124 and the spacer 130 positioned on the second conductive layer 123 are, and correspondingly, the poorer the protective effect provided by the protective layer 124 and the spacer 130 to the first conductive layer 121, the intermediate layer 122 and the second conductive layer 123 is. However, the less the overlapped portions are, the better the protective effect provided by the protective layer 124 and the spacer 130 to the first conductive layer 121, the intermediate layer 122 and the second conductive layer 123 is. That is, by setting the width of the overlapped portion to be less than or equal to 0.1 to 0.5 of that of the gate stack layer 120, a certain protective effect can be provided while increasing the breakdown area between the gate stack layer 120 and the contact structure 140.

The embodiments of the present disclosure provide a method for fabricating a semiconductor structure. The dielectric layer 150 is formed on the second sidewall of the gate stack layer 120, where the thickness of the dielectric layer 150 is smaller than that of the spacer 130. Next, the contact structure 140 in contact with the surface of the dielectric layer 150 is formed, where the contact structure 140 is arranged adjacent to the gate stack layer 120, and the thickness of the dielectric layer 150 between the gate stack layer 120 and the contact structure 140 is reduced, thus the breakdown path of the semiconductor structure is changed to the gate stack layer 120—the dielectric layer 150—the contact structure 140. Controlling breakdown of the dielectric layer 150 may cause the semiconductor structure to be broken down, which may reduce the breakdown difficulty of the entire semiconductor structure and reduce the transmission path for transmission of an entire electrical signal. In this way, loss of the electrical signal can be reduced during transmission of the electrical signal, and thus sensitivity of the semiconductor structure can be improved.

Those of ordinary skill in the art can understand that the above-mentioned embodiments are some embodiments for realizing the present disclosure, but in practical applications, various changes may be made to them in form and details without departing from the spirit and scope of the embodiments of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. A semiconductor structure, comprising:
   a substrate and a gate oxide layer positioned on a surface of the substrate;
   a gate stack layer positioned on a surface of the gate oxide layer;
   a spacer at least covering a first sidewall of the gate stack layer;
   a contact structure at least positioned on the surface of the substrate; and
   a dielectric layer at least positioned between the contact structure and a second sidewall of the gate stack layer, the first sidewall and the second sidewall being arranged opposite to each other, and a thickness of the dielectric layer being less than a thickness of the spacer.

2. The semiconductor structure according to claim 1, wherein the spacer is further positioned on part of a top surface of the gate stack layer, part of the contact structure being positioned above the gate stack layer.

3. The semiconductor structure according to claim 2, wherein a projection of the contact structure on the surface of the substrate is overlapped with a projection of the gate stack layer on the surface of the substrate, a width of an overlapped portion being less than or equal to 0.1 to 0.5 of a width of the gate stack layer.

4. The semiconductor structure according to claim 1, wherein the thickness of the dielectric layer is less than a thickness of the gate oxide layer.

5. The semiconductor structure according to claim 1, wherein part of the contact structure is positioned within an active area of the substrate.

6. The semiconductor structure according to claim 5, wherein the contact structure comprises a contact layer, a barrier layer and a conductive layer, the barrier layer being positioned between the contact layer and the conductive layer, and the contact layer being positioned within the active area.

7. The semiconductor structure according to claim 1, wherein the thickness of the dielectric layer is less than or equal to 3 nm.

8. A method for fabricating a semiconductor structure, comprising:
   providing a substrate, a gate oxide layer being formed on a surface of the substrate, and a gate stack layer being formed on the gate oxide layer;
   forming a spacer at least covering a first sidewall of the gate stack layer;
   forming a dielectric layer at least covering a second sidewall of the gate stack layer, the first sidewall and the second sidewall being arranged opposite to each other, and a thickness of the dielectric layer being less than a thickness of the spacer; and
   forming a contact structure at least positioned on the surface of the substrate, the contact structure being in contact with a surface of the dielectric layer.

9. The method for fabricating a semiconductor structure according to claim 8, wherein the forming the spacer comprises:
   forming an initial spacer covering a sidewall and a top surface of the gate stack layer and a surface of the substrate; and
   patterning the initial spacer, and removing the initial spacer on a surface of the second sidewall of the gate stack layer, rest of the initial spacer on a surface and a top surface of the first sidewall of the gate stack layer being used as the spacer.

10. The method for fabricating a semiconductor structure according to claim 9, wherein the patterning the initial spacer comprises:
    forming a groove, the groove exposing at least the second sidewall and part of the top surface of the gate stack layer, and the groove further exposing the substrate.

11. The method for fabricating a semiconductor structure according to claim 10, wherein the forming the dielectric layer comprises: depositing a dielectric material on a sidewall and a bottom of the groove, removing the dielectric material at the bottom of the groove, and forming a dielectric layer covering the second sidewall of the gate stack layer.

12. The method for fabricating a semiconductor structure according to claim 11, wherein before removing the dielectric material at the bottom of the groove, the method further comprises: performing ion implantation on the substrate at the bottom of the groove.

13. The method for fabricating a semiconductor structure according to claim 10, wherein the forming the contact structure comprises:
    forming a contact layer at the bottom of the groove, the contact layer being electrically connected to the substrate;
    forming a barrier layer positioned on the surface of the dielectric layer and a top surface of the contact layer; and
    forming a conductive layer filling up the groove.

14. The method for fabricating a semiconductor structure according to claim 10, wherein the forming the dielectric layer comprises: controlling a thickness of the dielectric layer to be smaller than a thickness of the gate oxide layer.

15. The method for fabricating a semiconductor structure according to claim 8, wherein a projection of the contact structure on the surface of the substrate is overlapped with a projection of the gate stack layer on the surface of the substrate, a width of an overlapped portion being less than or equal to 0.1 to 0.5 of a width of the gate stack layer.

* * * * *